(12) United States Patent
Krein et al.

(10) Patent No.: US 8,535,968 B1
(45) Date of Patent: Sep. 17, 2013

(54) HIGH SPEED ALIGNING OF PHOTOVOLTAIC CELLS

(75) Inventors: Bruce Krein, Campbell, CA (US); Frank Lema, Fremont, CA (US)

(73) Assignee: Miasole, Santa Clara, CA (US)

( * ) Notice: Subject to any disclaimer, the term of this patent is extended or adjusted under 35 U.S.C. 154(b) by 46 days.

(21) Appl. No.: 13/362,952

(22) Filed: Jan. 31, 2012
(Under 37 CFR 1.47)

Related U.S. Application Data

(60) Provisional application No. 61/438,078, filed on Jan. 31, 2011.

(51) Int. Cl.
*H01L 21/00* (2006.01)

(52) U.S. Cl.
USPC ............ 438/66; 438/59; 438/71; 438/694; 700/90; 700/112; 700/213; 700/218; 257/E21.521

(58) Field of Classification Search
None
See application file for complete search history.

(56) References Cited

U.S. PATENT DOCUMENTS

2004/0107014 A1 * 6/2004 Park ............................. 700/90

* cited by examiner

*Primary Examiner* — Kyoung Lee
(74) *Attorney, Agent, or Firm* — Weaver Austin Villeneuve & Sampson LLP

(57) ABSTRACT

Provided are novel photovoltaic cell alignment apparatuses and methods for fabricating photovoltaic module sub-assemblies that include multiple aligned photovoltaic cells. The apparatuses and methods provide high-speed precise alignment of the cells with respect to each other and other components of a photovoltaic module. In certain embodiments, a set of photovoltaic cells is first aligned on an alignment plate of an alignment apparatus and then transferred to a sealing sheet of the module such that the respective alignments of the cells are maintained during transfer. The alignment plate may include multiple cell receiving areas that have corresponding alignment edges. Aligning photovoltaic cells on this plate may involve forcing the cells against the alignment edges and/or moving the cells in the receiving areas in a direction parallel to the alignment edges.

43 Claims, 8 Drawing Sheets

HIGH SPEED ALIGNING OF PHOTOVOLTAIC CELLS

CROSS-REFERENCE TO RELATED APPLICATIONS

This application claims the benefit of U.S. Provisional Application No. 61/438,078, filed Jan. 31, 2011, entitled "HIGH SPEED ALIGNING OF PHOTOVOLTAIC CELLS," which is incorporated herein by reference in its entirety for all purposes.

BACKGROUND

Photovoltaic cells are widely used for electricity generation, with multiple photovoltaic cells interconnected in module assemblies. Such modules may in turn be arranged into arrays to convert solar energy into electricity by the photovoltaic effect. Photovoltaic cells are typically arranged in sets, and these sets are protected inside the modules by two sealing sheets and one or more encapsulant layers. With increasing adoption of photovoltaic technologies comes demand for faster and more efficient fabrication processing.

SUMMARY

Provided are novel photovoltaic cell alignment apparatuses and methods for fabricating photovoltaic module sub-assemblies that include multiple aligned photovoltaic cells. Photovoltaic cells have unique characteristics requiring special handling techniques and mechanisms. The apparatuses and methods provide high-speed precise alignment of the cells with respect to each other and other components of a photovoltaic module. In certain embodiments, a set of photovoltaic cells is first aligned on an alignment plate of an alignment apparatus and then transferred to a sealing sheet of the module such that the respective alignments of the cells are maintained during transfer. The alignment plate may include multiple cell receiving areas that have corresponding alignment edges. Aligning photovoltaic cells on this plate may involve forcing the cells against the alignment edges and/or moving the cells in the receiving areas in a direction parallel to the alignment edges. In certain embodiments, the apparatuses and methods provide high speed precise placement of all photovoltaic cells of a module, enabling high throughput solar module fabrication.

In certain embodiments, a photovoltaic cell alignment apparatus for fabricating a photovoltaic module sub-assembly includes a photovoltaic cell storage cassette for storing multiple photovoltaic cells, a rotary photovoltaic cell feeder having at least one photovoltaic cell grabber offset with respect to an axis of the feeder, and an alignment plate. The alignment plate has a top surface defined by multiple angled cell receiving areas having alignment edges. The alignment plate and/or the rotary cell feeder are movable along a second axis with respect to each other, which allows positioning any angled cell receiving areas of the plate with respect to a cell grabber of the rotary feeder in one of the cell grabber's positions. One or more cell grabbers may rotate about the rotary feeder's axis between a first position, at which the at least one grabber is aligned with the photovoltaic cell storage cassette, and a second position, at which the grabber faces the alignment plate. In the first position, the cell grabber is configured to pull a single photovoltaic cell from the storage cassette and, in certain embodiments, to support this cell in substantially the same position relative to the grabber while the grabber moves from its first position to its second position. In the second position, the grabber is configured to release the cell into one of the angled cell receiving areas of the alignment plate.

In certain embodiments, an alignment plate includes one or more magnets configured to exert a width-wise directional force on photovoltaic cells located in the receiving areas to align the cells against the alignment edges. In the same or other embodiments, an alignment apparatus includes a length-wise rotational alignment mechanism having a rotatable disk and a pin positioned at a predetermined distance from the center of the rotatable disk. The length-wise alignment mechanism may be configured to push photovoltaic cells positioned in the receiving areas in length-wise directions (e.g., parallel to the alignment edge), while the mechanism rotates about its center. The length-wise alignment mechanism may also include a rotational biasing mechanism including a rotatable biasing disk and a biasing pin positioned at a predetermined biasing distance from the center of the biasing disk. The rotational biasing mechanism may be configured to push any photovoltaic cells extending beyond a biasing line towards the biasing line while rotating about its center. The length-wise rotational alignment mechanism may be configured to substantially align (e.g., less than about 1 millimeter) all photovoltaic cells on the alignment plate against an alignment line.

In certain embodiments, photovoltaic cell grabbers include suction cups and/or magnets. In the same or other embodiments, a photovoltaic cell grabber has an axle and two or more projections. In certain embodiments, at least one of the cell grabber projections is offset with respect to other projections (e.g., using a surface of the photovoltaic cell as a reference) when at least one photovoltaic cell grabber is in the first position. In certain embodiments, a photovoltaic cell storage cassette includes an opening for individually removing photovoltaic cells and a magnet for separating the photovoltaic cells during the removal.

In certain embodiments, a photovoltaic cell alignment apparatus also includes a photovoltaic cell transfer mechanism configured to simultaneously transfer multiple photovoltaic cells from an alignment plate while substantially maintaining the relative positions of he cells. The relative positions and alignment may have been established during alignment of multiple photovoltaic cells on an alignment plate. The transfer mechanism may include multiple transfer projections such that each cell receiving area of the alignment plate has at least two corresponding transfer projections. These transfer projections may include transfer suction cups. certain embodiments, a photovoltaic cell transfer mechanism is configured to detect the presence of the photovoltaic cells in the cell receiving areas by monitoring a vacuum profile in the transfer suction cups used for transferring the cells. For example, angled cell receiving areas may include one or more through holes corresponding to the transfer suction cups such that the through holes coincide with the suction cups when the transfer suction cups engage the cells. If at least one cell is not present in a corresponding receiving area, then the corresponding suction cup will not reach a required pressure level and the transfer operation will be aborted.

Provided also is a photovoltaic cell alignment apparatus for fabricating a module sub-assembly. The apparatus includes an alignment plate and a photovoltaic cell transfer mechanism. The alignment plate may have a top surface defined by multiple angled cell receiving areas. Each cell receiving area has an alignment edge configured for aligning photovoltaic cells. The transfer mechanism may be configured to simultaneously transfer multiple cells from the receiving areas onto a sealing sheet while substantially maintaining the relative positions of the cells. The transfer mechanism may include multiple transfer arms, each transfer arm including multiple transfer projections facing the alignment plate. The projections may be configured to pick multiple cells from receiving areas, to rigidly support the cells during the transfer, and to release the cells onto a sealing sheet. These arms may be movable with respect to the alignment plate along a first transfer axis to engage the transfer projections with the photovoltaic cells. The transfer arms may be also movable with respect to the alignment plate along a second transfer axis to transfer the cells between the alignment plate area and the sealing sheet. In certain embodiments, transfer arms are movable with respect to a sealing sheet along a third transfer axis to position the multiple photovoltaic cells on the sealing sheet by releasing the cells from the projections (e.g., a vertical axis with respect to the sealing sheet). In certain embodiments, each photovoltaic cell may be supported by at least two transfer projections during transfer. The two transfer projections may be positioned on the same or different transfer arms.

Also provided is a photovoltaic cell alignment apparatus that includes a storage cassette, a feeding device having multiple suction cups, an alignment plate with alignment slots and edges, a cell transfer mechanism for transferring cells from the alignment plate while substantially maintaining their relative positions, and a programmable controller. The programmable controller may include program instructions for providing multiple cells in the storage cassette, individually removing the cells from the cassette using a rotary cell feeder, and individually positioning the cells into cell receiving areas of the alignment plate while moving the alignment plate with respect to the rotary cell feeder. The program instructions may also control aligning the photovoltaic cells width-wise and length-wise in the cell receiving areas and simultaneously transferring the photovoltaic cells from the alignment plate to a sealing sheet while substantially maintaining the relative positions of the cells during the transfer.

Also provided are methods of fabricating a photovoltaic module sub-assembly. These methods may be used in accordance with the apparatuses described herein, though are not limited to use of these apparatuses. In certain examples, a fabrication method involves providing multiple photovoltaic cells in a photovoltaic cell storage cassette and individually removing the cells from the storage cassette using a rotary cell feeder. The method may continue with individually positioning the photovoltaic cells into cell receiving areas of an alignment plate while moving the alignment plate with respect to the rotary cell feeder. The cell receiving areas may have angled bottom surfaces and alignment edges. The method may also involve aligning the photovoltaic cells width-wise and/or length-wise in the receiving areas to ensure relative positions of the photovoltaic cells as desired in the photovoltaic module. The method may continue with simultaneously transferring the photovoltaic cells from the alignment plate to a sealing sheet while substantially maintaining the relative positions of the cells during the transfer. The sealing sheet may be made from materials such as a glass sheet, a polyethylene terephthalate (PET) sheet, and an encapsulant sheet.

Width-wise aligning of cells on an alignment plate may involve exerting electromagnetic forces on the cells using one or more magnets installed in the alignment plate. This operation may further involve aligning the cells against the alignment edges of the plate. In the same or other embodiments, the width-wise aligning includes exerting mechanical forces on the cells by moving the cells with respect to, for example, a soft brush contacting each of the photovoltaic cells to push the cells against the respective alignment edges.

In certain embodiments, length-wise aligning involves pushing photovoltaic cells in an alignment direction along the lengths of the photovoltaic cells using a rotary alignment mechanism. This may cause the cells to be aligned along an alignment line. The length-wise aligning may also involve, prior to pushing the cells in the alignment direction, pushing at least a subset of the cells in a bias direction opposite of the alignment direction. This may be done using a rotary bias device. This bias pushing offsets the cells in the bias direction from the alignment line prior to pushing the photovoltaic cells in the alignment direction.

In certain embodiments, photovoltaic cells transferred onto the first sealing sheet are positioned within less than about 1 millimeter with respect to length-wise target positions. This value, at least in part, indicates alignment precision of the cells after the transfer. In more specific embodiments, photovoltaic cells transferred onto the sealing sheet are positioned within less than about 0.5 millimeters with respect to width-wise target positions. In certain embodiments, photovoltaic cells are individually removed from a photovoltaic cell storage cassette and individually positioned into their respective cell receiving areas on the alignment plate at an average speed of at least about 4 cells per second.

In certain embodiments, at least ten photovoltaic cells are simultaneously transferred from an alignment plate to a sealing sheet while substantially maintaining the relative positions of the cells during the transfer. Transferring may involve simultaneously contacting multiple photovoltaic cells with transfer projections such that each photovoltaic cell is contacted by at least two transfer projections. Transferring may also involve simultaneously lifting all photovoltaic cells from the cell receiving areas. Transferring may continue with positioning the cells over a predetermined location on the sealing sheet and simultaneously releasing the cells from the transfer cell projections onto the sealing sheet. In certain embodiments, a transfer operation is repeated at least once for the first sealing sheet. The process may also involve detecting presence of cells in respective receiving areas by monitoring a vacuum profile in suction cups of the transfer projections. This may be done prior or during the transfer, e.g., when suction cups of the transfer mechanism engage with photovoltaic cells or empty slots.

In certain embodiments, photovoltaic cells are between about 50 millimeters and 1000 millimeters in length and between about 10 millimeters and 200 millimeters in width. Photovoltaic cells may include a stainless steel substrate having a thickness of between about 2 mils and 50 mils. In particular embodiments, photovoltaic cells include a ferromagnetic substrate. A photovoltaic cell may include a substrate supporting a photovoltaic stack and an interconnect partially overlapping the stack or the substrate. Individually positioning the photovoltaic cells (e.g., during aligning the cells on the alignment plate) involves positioning them such that partial overlap of an interconnect of one cell with a photovoltaic stack or a substrate of an adjacent cell results.

In certain embodiments, a fabrication method also involves positioning a second sealing sheet over the multiple photovoltaic cells to form a photovoltaic stack. The method may continue with laminating the stack while substantially maintaining the relative positions of the cells. In certain embodiments, some operations may be performed in parallel. For example, positioning a first set of photovoltaic cells into cell receiving areas of the alignment plate and transferring a second set of the cells from the alignment plate may be performed in parallel. An alignment plate may be a part of an alignment belt continuously moving in the photovoltaic cell alignment apparatus at a predetermined speed.

In certain embodiments, individually positioning photovoltaic cells into cell receiving areas of the alignment plate involves positioning the cells such that at least some portions of the lengths of the cells extend on each side of the alignment plate allowing the photovoltaic cells to be moved in a lengthwise direction during aligning of the photovoltaic cells. In the same or other embodiments, a method also involves exerting a force on photovoltaic cells to prevent their misalignment caused by alignment plate's motion or by various components of the apparatus contacting the photovoltaic cells.

These and other aspects of the invention are described further below with reference to the figures.

DETAILED DESCRIPTION OF EXAMPLE EMBODIMENTS

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.
Introduction Photovoltaic cells have unique characteristics that often require special handling techniques and mechanisms. For example, photovoltaic cells often have a thin substrate used as a carrier and support for one or more thin semiconductor layers. A substrate may be made from made from one or more ferromagnetic materials, which may present additional challenges as well as opportunities in handling photovoltaic cells. One example of such substrates is a stainless steel foil. These semiconductor layers can be fragile and need to be protected during handling. At the same time, photovoltaic cells can be relatively large in size, e.g., between about 50 millimeters and 1000 millimeters in length and/or between about 10 millimeters and 200 millimeters in width, which also leads to handling and alignment challenges. Additional complexities can come from electrical connectors that are positioned on one or both surfaces of some cells prior to their assembly into sets. The electrical connectors can extend outside of the respective cell boundaries in order to establish electrical connections with adjacent cells. However, these electrical connectors can greatly interfere with alignment and handling. The photovoltaic cell alignment apparatuses and methods described herein provide high speed alignment and placement of photovoltaic cells in a partially fabricated photovoltaic module.

Figure 1:
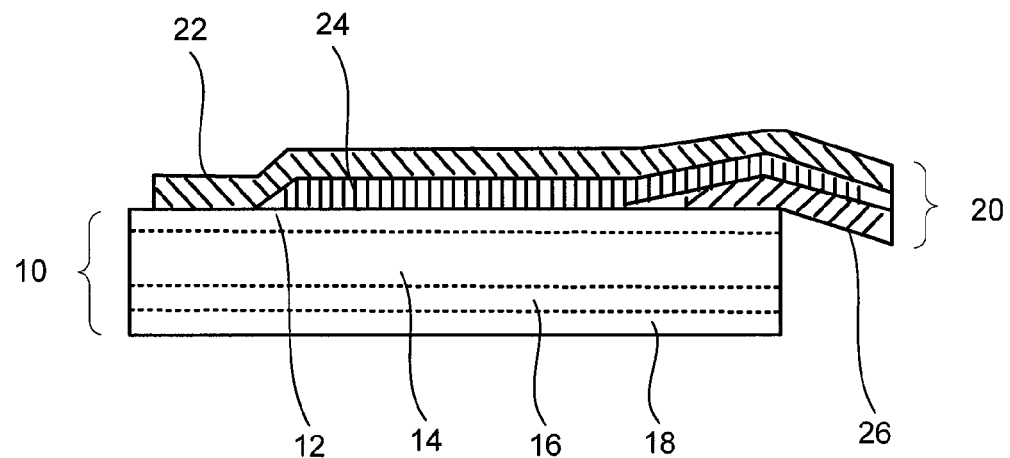
FIG. 1 is a schematic representation of a photovoltaic cell in accordance with certain embodiments.

To provide a better understanding of various features of the novel alignment apparatuses and methods, some examples photovoltaic cells will now be briefly described. It should be understood that the proposed apparatuses and methods may be used for other types of photovoltaic cells as well. FIG. 1 is a schematic representation of a photovoltaic cell 10 and a portion of a current collector 20 in accordance with certain embodiments. Photovoltaic cell 10 includes a semiconductor layer 14, which in turn may include copper indium gallium selenide (CIGS), cadmium-telluride (Cd—Te), amorphous silicon (a-Si), micro-crystalline silicon, and crystalline silicon (c-Si) or other semiconductor materials. Semiconductor layer 14 includes a semiconductor junction that is configured to generate a voltage when it is exposed to sun light. A typical thickness of a CIGS/CdS bilayer that includes a CIGS/CdS junction may be between about 500 nanometers to 3,000 nanometers, for example, between about 1,500 nanometers and 2,000 nanometers. According to various embodiments, the thicknesses of semiconductor junctions may be within or outside these ranges, depending on the type of junction employed.

Semiconductor layer 14 may be positioned adjacent to a back conductive layer 16, which, in certain embodiments, is a thin layer of molybdenum, niobium, copper, and/or silver. Photovoltaic cell 10 generally also includes a substrate 18, which may be used for mechanical support of semiconductor junction 14 and other layers. In certain embodiments, substrate 18 is made from a conductive material, such as a metal or a conductive polymer. Examples of some metallic substrates include stainless steel foil, titanium foil, copper foil, aluminum foil, and beryllium foil. In certain embodiments, substrate 18 has a thickness of between about 2 mils and 50 mils, e.g., about 10 mils, with other thicknesses also in the scope of the invention. Photovoltaic cell 10 may also include a top conductive layer 12. This layer typically includes one or more transparent conductive oxides (TCO), such as zinc oxide, aluminum-doped zinc oxide (AZO), indium tin oxide (ITO), and gallium doped zinc oxide. A typical thickness of top conductive layer 12 is between about 100 nanometers to 1,000 nanometers, for example between about 200 nanometers and 800 nanometers, with other thicknesses within the scope of the invention.

FIG. 1 illustrates photovoltaic cell 10 coupled to current collector 20. Current collector 20 may be attached to and/or disposed on top conductive layer 12 and is configured to collect current from top conductive layer 12. Current collector 20 may also provide an electrical connection to an adjacent cell (not shown) connected in series or in parallel with cell 10. The current collector 20 includes a conductive component 24 (e.g., an electrical trace or wire) that contacts top conductive layer 12 (e.g., a TCO layer) of cell 10. Current collector 20 may further include a top carrier film 22 and/or a bottom carrier film 26, which may be made from insulating materials to prevent electrical shorts with other elements of cell 10 and/or module.

Figure 2:
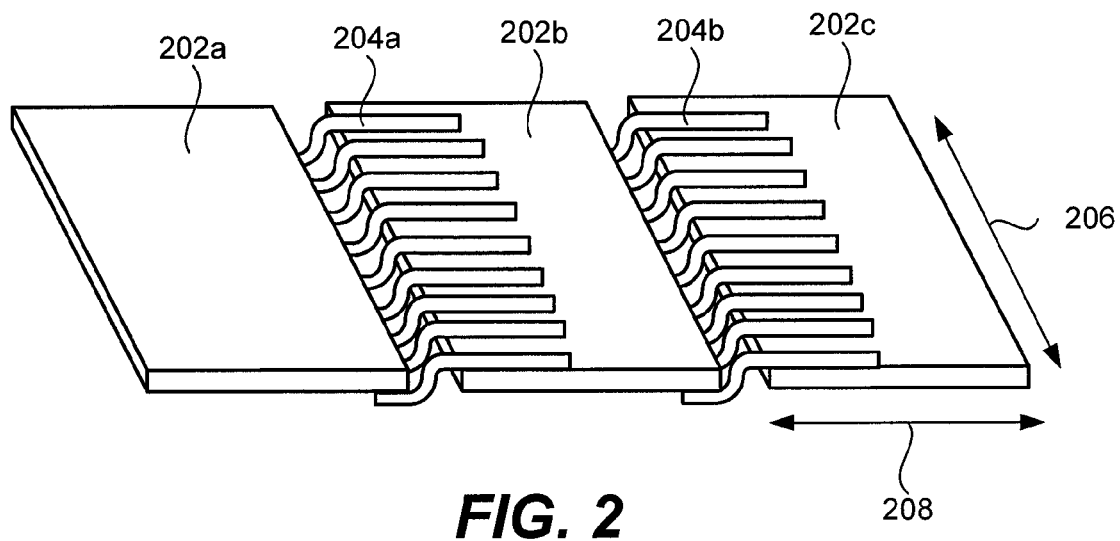
FIG. 2 is a schematic representation of a set of electrically interconnected cells with connector tabs in accordance with certain embodiments.

Generally, a photovoltaic module includes multiple photovoltaic cells that may be electrically interconnected with each other. Electrical interconnections and/or other factors often require precise alignment of the cells with respect to each other. FIG. 2 illustrates three aligned and interconnected cells 202a, 202b, and 202c in accordance with certain embodiments. Cells 202a, 202b, and 202c are interconnected with two sets of current collectors 204a and 204b, for example, similar to current collector 20 shown in FIG. 1. Current collector 204a may be initially attached to photovoltaic cell 202a or 202b. After positioning photovoltaic cells 202a and 202b on a sealing sheet (not shown) of the photovoltaic module and, in certain embodiments, after lamination of the module, current collector 204a forms an electrical connection between photovoltaic cells 202a and 202b. An electrical connection may not necessarily form during initial alignment of cells on an alignment plate of the alignment apparatus. In fact, in certain embodiments, contact between adjacent cells may be avoided altogether for alignment and other reasons.

Arrows 206 and 208 in FIG. 2 represent length-wise and width-wise alignment of photovoltaic cells respectively. In certain embodiments, after transfer onto a sealing sheet, photovoltaic cells are positioned within less than about 1 millimeter of their target positions in a length-wise direction (arrow 206). This length-wise alignment may be within less than about 0.5 millimeters. In the same or other embodiments, photovoltaic cells are positioned within less than about 0.5 millimeters of their target positions in a width-wise direction (arrow 208). This width-wise alignment may be within less than about 0.25 millimeters.

Figure 3:
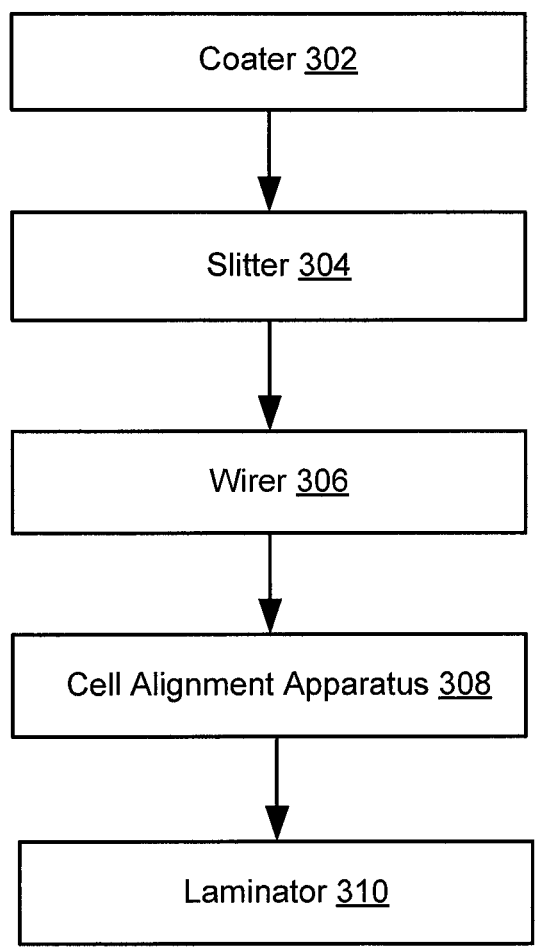
FIG. 3 is a block diagram representing various elements a photovoltaic module processing system in accordance with certain embodiments.

As briefly mentioned above, alignment of the cells is performed and then maintained during subsequent operations, such as installing diodes, positioning a second sealing sheet, and laminating. FIG. 3 is a block diagram representing various elements of an example of a photovoltaic module processing system in accordance with certain embodiments. Block 302 represents a thin film deposition coater used for depositing light absorbing and other materials onto a substrate. Various examples of substrate and light absorbing materials are described above. Coater 302 may be configured to deposit the thin film materials on rolls or webs of substrate material.

After deposition, the substrate having thin films deposited thereon is transferred to a cutter/slitter 304, where it may be cut in a variety of manners to wholly or partially define cells or a module. A wirer 306 may be then employed to provide electrical connections to the cells, e.g., for later interconnection between cells. A cell alignment apparatus 308 then arranges individual cells into a set of aligned cells, which is further described below in more detail. A module laminator 310 encapsulates the cells and other module components between front and back encapsulating layers that protect the interconnected cells and other module components from environmental conditions. In certain embodiments, additional system components include but are not limited to web IV testers, cell testers and sorters, diode and bus positioners, and module testers.

Photovoltaic Cell Alignment Apparatus Examples

Figure 4A:
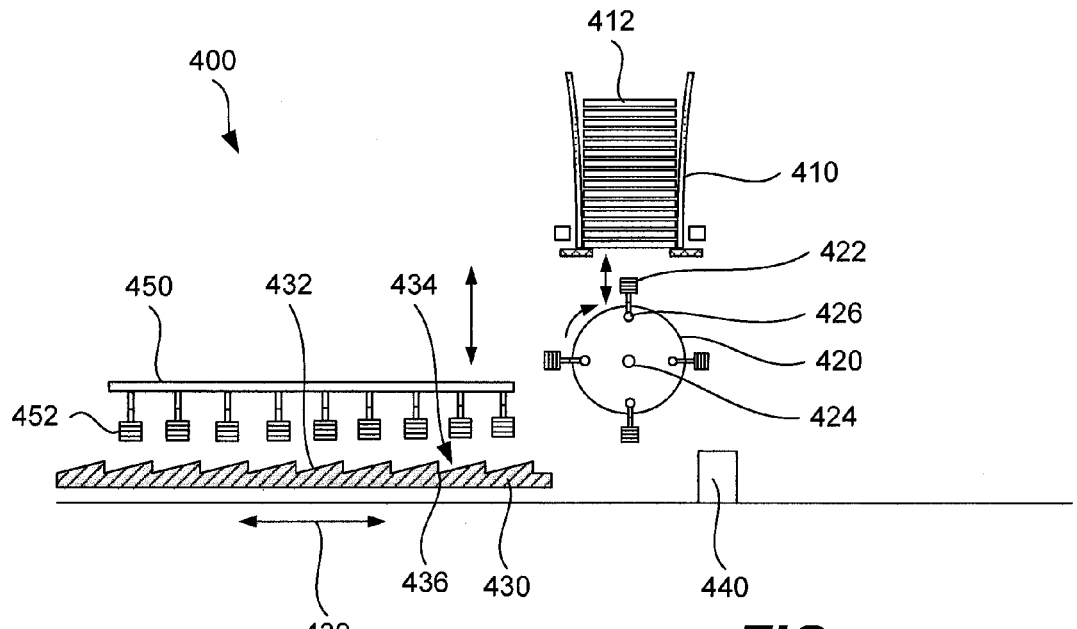
FIGS. 4A and 4B are schematic side and top views of a photovoltaic cell alignment apparatus for fabricating photovoltaic module sub-assemblies in accordance with certain embodiments.

FIG. 4A is a schematic side view of a photovoltaic cell alignment apparatus 400 for fabricating photovoltaic module sub-assemblies in accordance with certain embodiments. Apparatus 400 has a storage cassette 410, a rotary photovoltaic cell feeder 420, an alignment plate 430, an alignment mechanism 440, and a transfer mechanism 450. Storage cassette 410 is used to provide multiple photovoltaic cells 412 into apparatus 400. Rotary feeder 420 includes one or more cell grabbers 422 arrayed around an axis 424 of the feeder. Alignment plate 430 has a top surface 432 defined by multiple angled cell receiving areas 434 each having an alignment edge 436. As shown, alignment plate 430 and/or rotary cell feeder 420 are movable with respect to each other along a horizontal/"second" axis (i.e., left-right as shown by arrow 439 in FIGS. 4A and 4B). This allows cell grabbers 422 of rotary cell feeder 420 to be appropriately positioned with respect to different cell receiving areas 434 of alignment plate 430 during positioning of the cells into the receiving areas.

Cell grabbers 422 may be rotatable about axis 424 of rotary feeder 420 between a first position, at which one of cell grabbers 422 is aligned with storage cassette 410, and a second position, at which the same cell grabber faces alignment plate 430. In the first position, cell grabbers 422 are configured to pull a single photovoltaic cell from storage cassette 410. In certain embodiments, cell grabbers 422 are equipped with suction cups and/or magnets to exert a force on the bottom cell in cassette 410 during this removal operation. This operation is further explained below in the context of FIG. 5B. Cell grabbers 422 may also be configured to reposition at different distances with respect to axis 424, i.e., to move further from and closer to axis 424. For example, cell grabbers 422 may have variable-length shafts (e.g., telescoping shafts) or be rotatable with respect to another axis (e.g., an axis 426 in FIG. 4A) offset from center axis 424 of rotary feeder. In the second position, cell grabbers 422 are configured to release photovoltaic cells into one of receiving areas 434 of alignment plate 430. In specific embodiments, a cell grabber 422 is configured to support a cell removed from storage cassette 410 in substantially the same position relative to the cell grabber, while the cell grabber carries the cell to the second position.

Figure 4B:
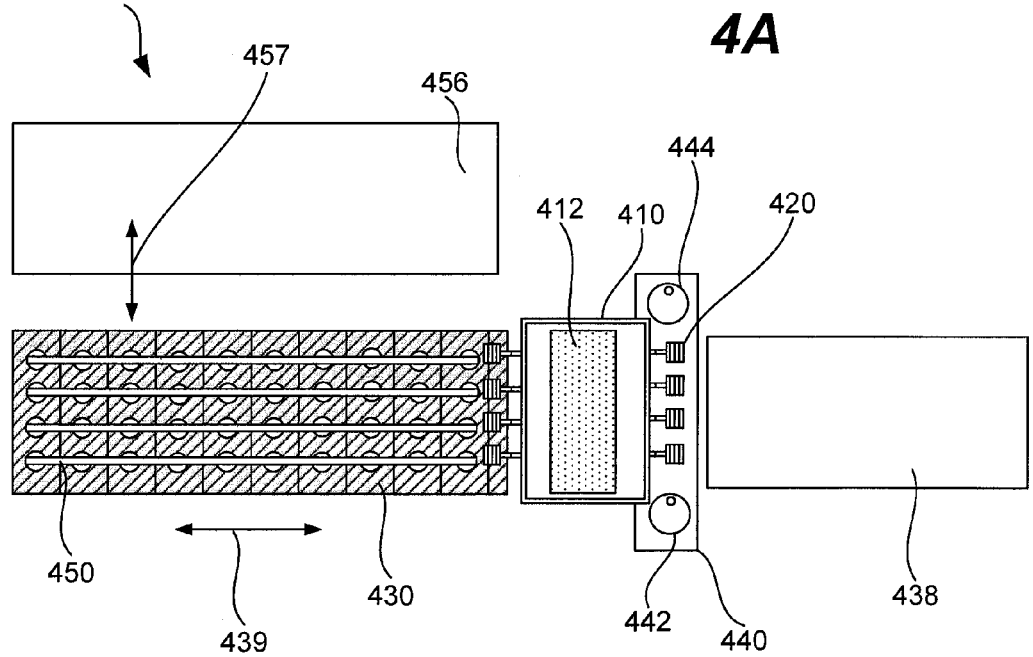

FIG. 4B is a schematic top view of photovoltaic cell alignment apparatus 400 for fabricating photovoltaic module sub-assemblies in accordance with certain embodiments. Apparatus 400 is shown with storage cassette 410 partially blocking rotary photovoltaic cell feeder 420, alignment plate 430 partially blocked by transfer mechanism 450, and alignment mechanism 440 having two length-wise alignment components 442 and 444. As mentioned above, alignment plate 430 can move with respect to cell feeder 420 in two directions 439. The same motion may advance alignment plate 430 with respect to alignment mechanism 440. As shown in FIG. 4B, alignment plate 430 may move to an area 448 past cell feeder 420 and two length-wise alignment components 442 and 444 (area 448 being right of cell feeder 420 and components 442 and 444 as shown in FIG. 4B). As plate 430 moves to the right past feeder 420, each cell receiving area 434 may receive one cell. All or some of the cells receiving areas 434 may receive a cell. After a cell is positioned in a corresponding cell receiving area, this area may pass through alignment mechanism 440 (e.g., elements 442 and 444 in FIG. 4B). Alignment mechanism 440 aligns the cell in its area as the area is in the mechanism. A cell may be partially or wholly aligned as alignment plate 430 moves to the right (i.e., to area 448) and/or when it returns to its original position on the left of rotary feeder 420.

In certain embodiments (not shown), cells are transferred from alignment plate 430, while the plate is still in area 448. In other words, alignment plate 430 returns back to the original position (on the left of cell feeder 420 in FIGS. 4A and 4B)

without cells after they have been transferred. In certain embodiments, an alignment plate is a belt that continuously moves only in one direction.

In the implementation shown in FIG. 4B, after alignment on alignment plate 430, cells are transferred using transfer mechanism 450 to a sealing sheet 456 by moving transfer mechanism in directions 457. As mentioned above, transfer mechanism 450 may be configured to simultaneously transfer multiple photovoltaic cells from alignment plate 430 to sealing sheet 456 or other module component while substantially maintaining the relative positions of the cells established on alignment plate 430. In certain embodiments, transfer mechanism 450 includes multiple transfer projections such that each cell receiving area 434 of alignment plate 430 is associated with at least two corresponding transfer projections. In specific embodiments, these transfer projections include suction cups and/or magnets. Suctions cups may be used in a combination with through holes of alignment plate 430 (discussed in more detail in the context of FIG. 7) to detect presence of photovoltaic cells in cell receiving areas by, for example, monitoring one or more vacuum profiles in the suction cups. In another embodiment, the presence of cells may be determined by monitoring magnetic field profiles, or other appropriate profile.

In the same or other embodiments, transfer mechanism 450 includes multiple transfer arms. Each transfer arm may correspond to each receiving area of alignment plate 430. Alternatively, transfer arms may extend along alignment plate's length (and perpendicular to the receiving areas). Transfer mechanism 450 may further include multiple transfer projections facing the alignment plate and configured to pick multiple cells from the receiving areas, to rigidly support the multiple photovoltaic cells during the transfer, and to release the multiple photovoltaic cells onto the sealing sheet. The transfer arms may be used to support the transfer projections. The transfer arms may be movable with respect to alignment plate 430 along a first transfer axis to engage the transfer projections with cells and along a second transfer axis to move the cells between an alignment plate area and a sealing sheet area. In certain embodiments, transfer arms are also movable with respect to the sealing sheet along a third transfer axis to position the cells on the sealing sheet by releasing the cells from its transfer projections. In certain embodiments, each photovoltaic cell is supported by at least two transfer projections of transfer mechanism 450 during the transfer. A set of projections supporting each cell may be position on different transfer arms. In specific embodiments, transfer projections include suction cups. FIGS. 4A and 4B provide an overview of one implementation of an apparatus; further details of various sub-components of the apparatus are described below with respect to FIGS. 5A-8C. One of skill in the art will understand the sub-components may vary according to the specific implementation.

Figure 5A:
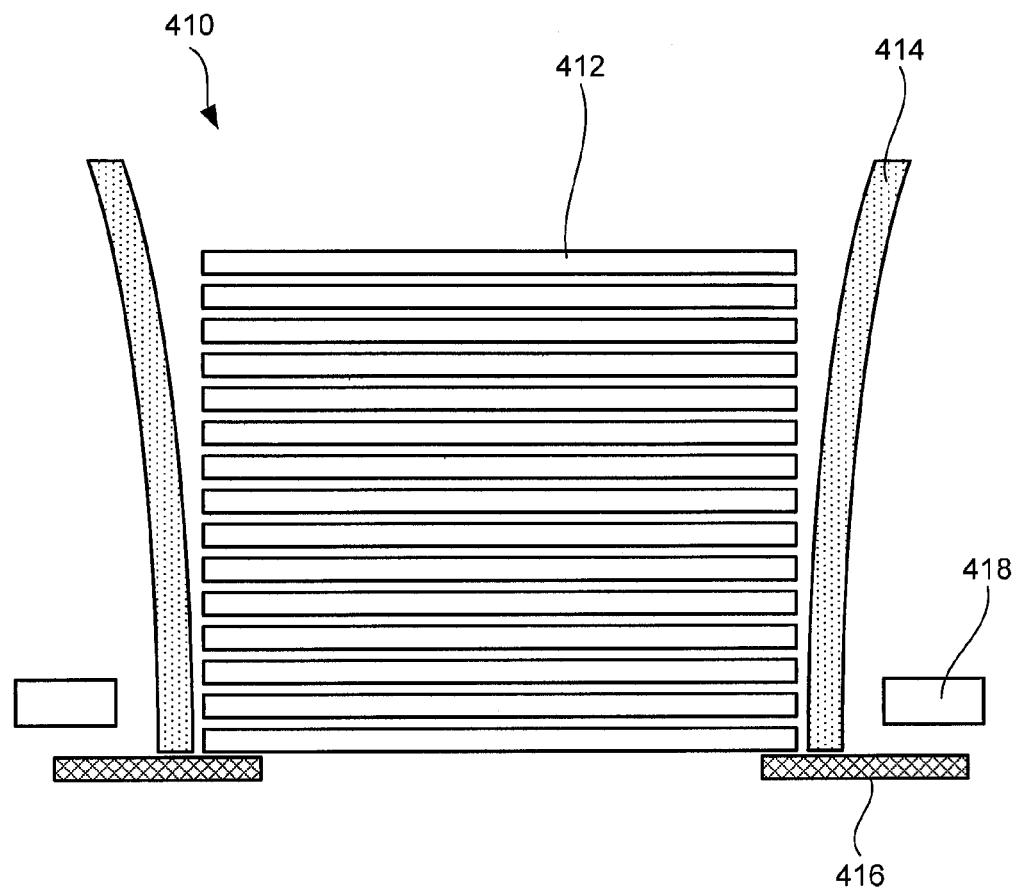
FIG. 5A is a schematic cross-section view of a photovoltaic cell storage cassette in accordance with certain embodiments.

As mentioned above, photovoltaic cells may be provided into an alignment apparatus in storage cassettes. FIG. 5A illustrates a cross-section of photovoltaic cell storage cassette 410 in accordance with certain embodiments. Storage cassette 410 may include a set of walls 414 forming a chute for supporting and, in certain embodiments, aligning a stack of photovoltaic cells 412. For example, walls 414 may be tapered from a receiving open end (at the top of cassette 410 in FIG. 5A) to a partially enclosed releasing end (at the bottom of cassette 410 in FIG. 5A).

Cells 412 may be supported in photovoltaic cell storage cassette 410 by a set of supports 416 positioned at the bottom of walls 414. Supports 416 may be attached directly to the walls 414 or other elements of photovoltaic cell storage cassette 410 or apparatus. Supports 416 may be rigid or flexible. Flexible supports may at least partially bend when cells are removed from photovoltaic cell storage cassette 410. Supports 416 form a partially enclosed releasing end/opening that allows one photovoltaic cell at a time to be removed through this opening while the rest of the cells remain in storage cassette 410.

Figure 5B:
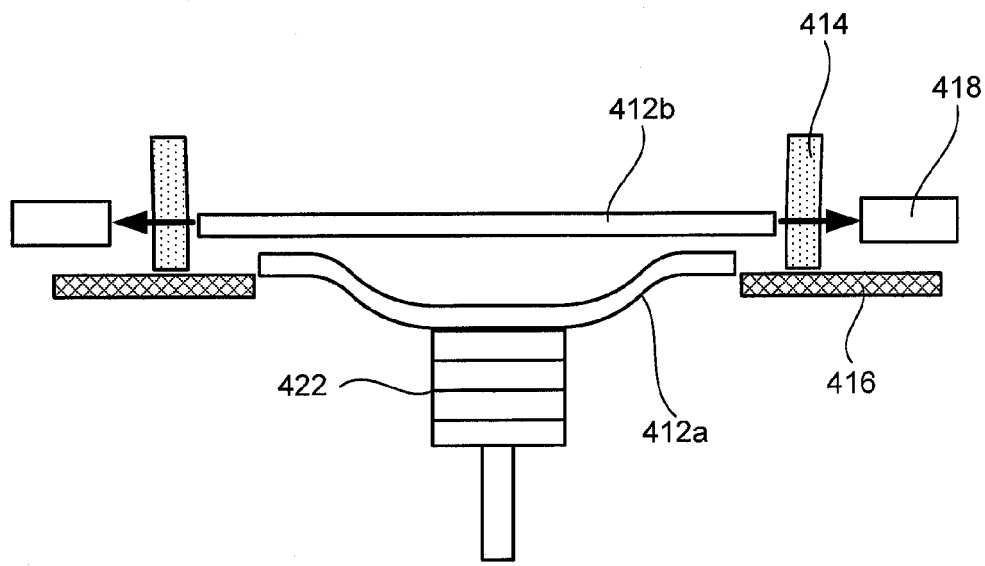
FIG. 5B is a schematic representation of a bottom portion of a photovoltaic cell storage cassette during removal of a bottom photovoltaic cell from the storage cassette in accordance with certain embodiments.

FIG. 5B is a schematic representation of a bottom portion of storage cassette 410 during removal of a bottom cell 412a. As shown, cell grabber 422 comes in contact with bottom cell 412a through the bottom opening formed by supports 416. Cell grabber 422 then exerts downward force on bottom cell 412a, effectively pulling it from the stack through the opening. Photovoltaic cells 412b that are positioned above bottom cells 412a remain support by bottom supports 416. In certain embodiments, to prevent upper cells 412b from being pulled through the opening together with bottom cell 412a, upper cells 412b may be additionally supported or "stretched" by electromagnetic forces generated by magnets 418. In this manner, electromagnetic forces generated by magnets 418 help to separate bottom cell 412a from the rest of cells 412b in bottom portion of storage cassette 410 during removal operation.

Figure 6:
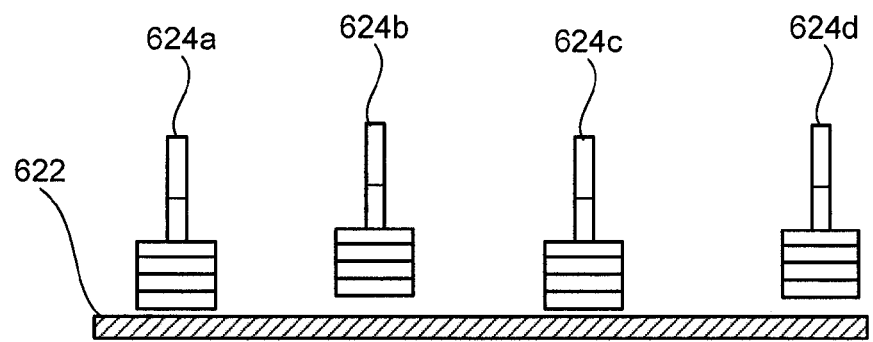
FIG. 6 is a schematic view of four suction cups positioned at different distances with respect to a photovoltaic cell in accordance with certain embodiments.

In certain embodiments, suction cups are used to support photovoltaic cells while being removed from storage cassette 410, moved between a first and a second position by rotary cell feeder 420, and/or moved between alignment plate 430 and a sealing sheet by transfer mechanism 450. Generally, a set of multiple suction cups are used to support each photovoltaic cell. In certain embodiments, at least one cup in the set is positioned at a different distance with respect to a plane corresponding to a front surface of a photovoltaic cell being picked up by this set. FIG. 6 illustrates a schematic side view of a set of multiple suction cups for supporting one photovoltaic cell in accordance with such embodiments. Specifically, suction cups 624a and 624c are positioned closer to a photovoltaic cell 622 than suction cups 624b and 624d. Without being restricted to any particular theory, it is believed that such or similar offset configuration may be more effective in picking up flexible flat components, such as photovoltaic cells. In particular, this configuration is effective in removing individual cells from a storage cassette similar to the ones described above in the context of FIGS. 5A and 5B.

Various modifications may be made to the storage cassette and cell grabbers described above with respect to FIGS. 5A-6 without departing from the scope of the invention. For example, magnetic or other forces may be used instead of or in addition to suction force.

Figure 7:
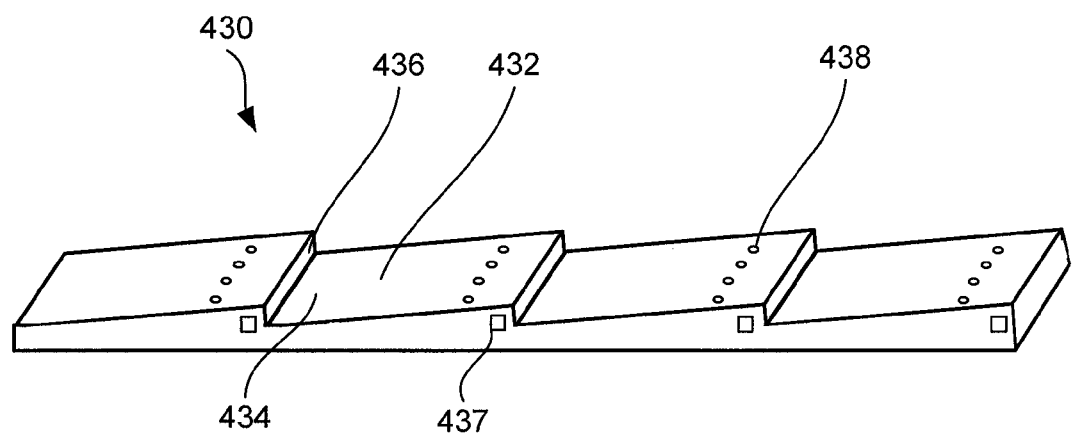
FIG. 7 is a schematic representation of an alignment plate in accordance with certain embodiments.

FIG. 7 is a schematic representation of alignment plate 430 in accordance with certain embodiments. Alignment plate 430 has a top surface 432 defined by multiple angled cell receiving areas 434 each having a corresponding alignment edge 436. As shown in FIG. 7, portions of top surface 432 corresponding to cell receiving areas 434 may be slightly angled, which may assist positioning photovoltaic cells (not shown) against alignment edges 436 by gravitational force. In certain embodiments, alignment plate 430 includes one or more magnets 437 configured to force photovoltaic cells in width-wise directions against alignment edges 434. Magnets 437 may be permanent magnets that continuously exert electromagnetic forces or temporary electrical magnets that can be turned on and off when needed. For example, magnets 437 may be turned off during initial distribution of cells form rotary feeder 420 and during transfer of cells from cell receiving areas 434 to a sealing sheet. Magnets 437 may be actuated temporary during, at least, width-wise alignment of cells.

In certain embodiments, alignment plate 430 also has one or more through holes 438 in each of cell receiving areas 434. As mentioned above, these holes 438 may coincide with suction cups of the transfer mechanism such that if a cell is missing in one of the predetermined area, then the transfer will not happen. More specifically, if a cell is missing from a receiving area, then suction cups corresponding to this receiving area will be engaging holes 438 (instead of a cell) of that receiving area. As such, the suction cups will not be able to achieve a predetermined lower pressure level and the transfer operation will be aborted.

In certain embodiments, a photovoltaic cell alignment apparatus includes a length-wise rotational alignment mechanism. This mechanism may have one or more rotatable disks for pushing photovoltaic cells positioned in receiving areas in a length-wise direction. A particular embodiment of a length-wise rotational alignment mechanism will now be described in more details in context of FIGS. 8A, 8B, and 8C, which are schematic illustrations of a set of photovoltaic cells at three different stages during length-wise alignment. Alignment mechanism 440 is shown with two rotatable disks 442 and 444. Each of these disks has a center and a pin positioned at a predetermined distance from the center (e.g., a pin 443 of rotatable disk 442 and a pin 445 of rotatable disk 444). These distances may be different for each of the disks. This center-offset configuration allows the pins to push photovoltaic cells in a length-wise direction away from the corresponding disks when the disks rotate around their centers. It should be noted that other mechanism may be used for moving cells in receiving areas in this direction, e.g., pushing pistons, pulling magnets, and moving the cells through a narrowing slot.

The purpose of the length-wise alignment mechanism is to ensure that photovoltaic cells or, more particularly, ends of the photovoltaic cells are positioned along the same alignment line. A storage cassette and/or rotary feeder often do not provide sufficient alignment. The length-wise alignment is achieved in some embodiments by moving some or all cells only in one direction or by moving some or all cells in two opposite directions. For example, cells may be specifically positioned by a rotary feeder into alignment slots such that their ends extend beyond an alignment line (i.e., "biased" in one direction). An alignment mechanism with only one rotatable disk may be then used to move all or most of cells back to the alignment position, i.e., such that their ends sufficiently aligned with the alignment line.

Figure 8A:
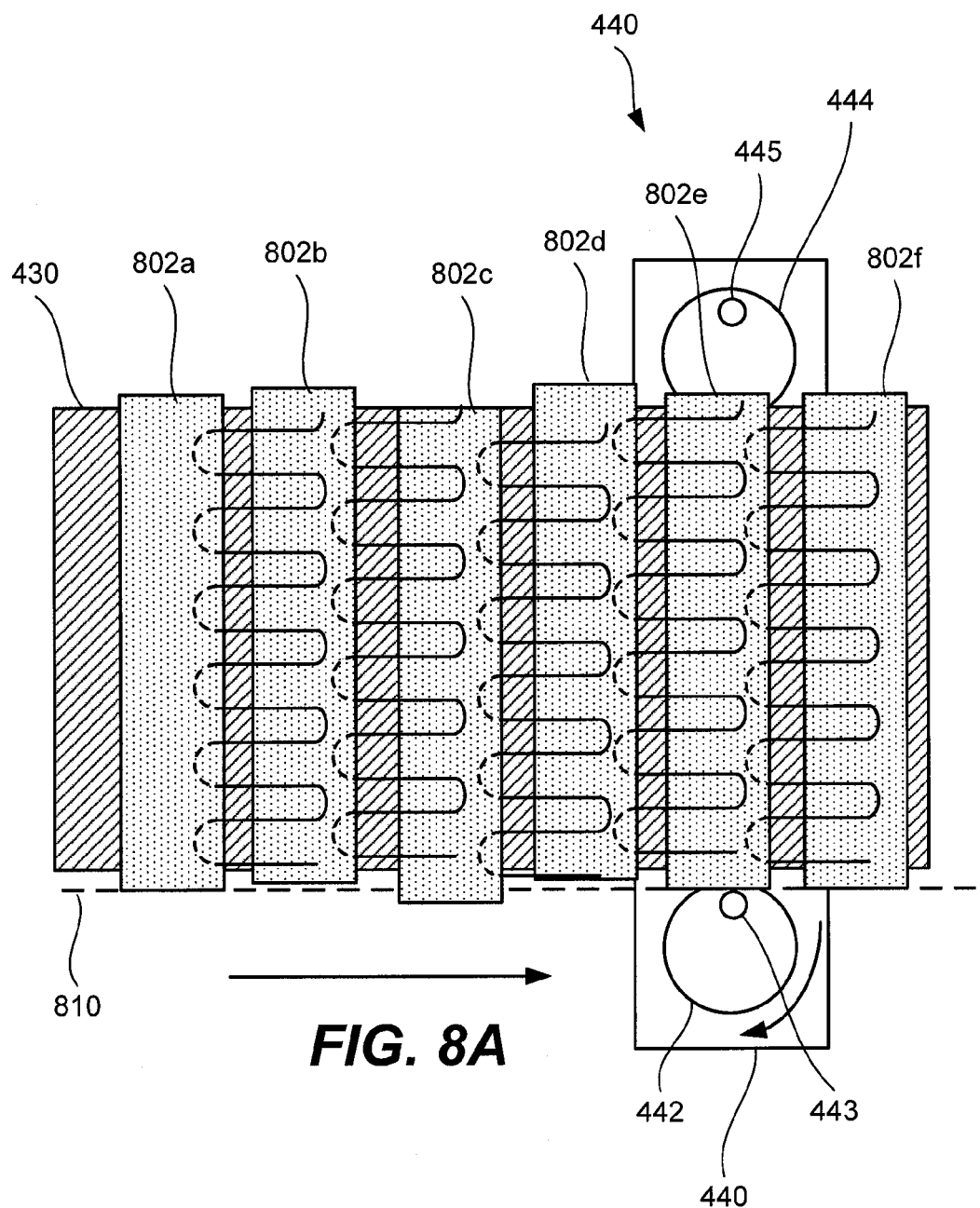
FIGS. 8A, 8B, and 8C are schematic illustrations of a set of photovoltaic cells at three different stages during a lengthwise alignment operation in accordance with certain embodiments.
Figure 8B:
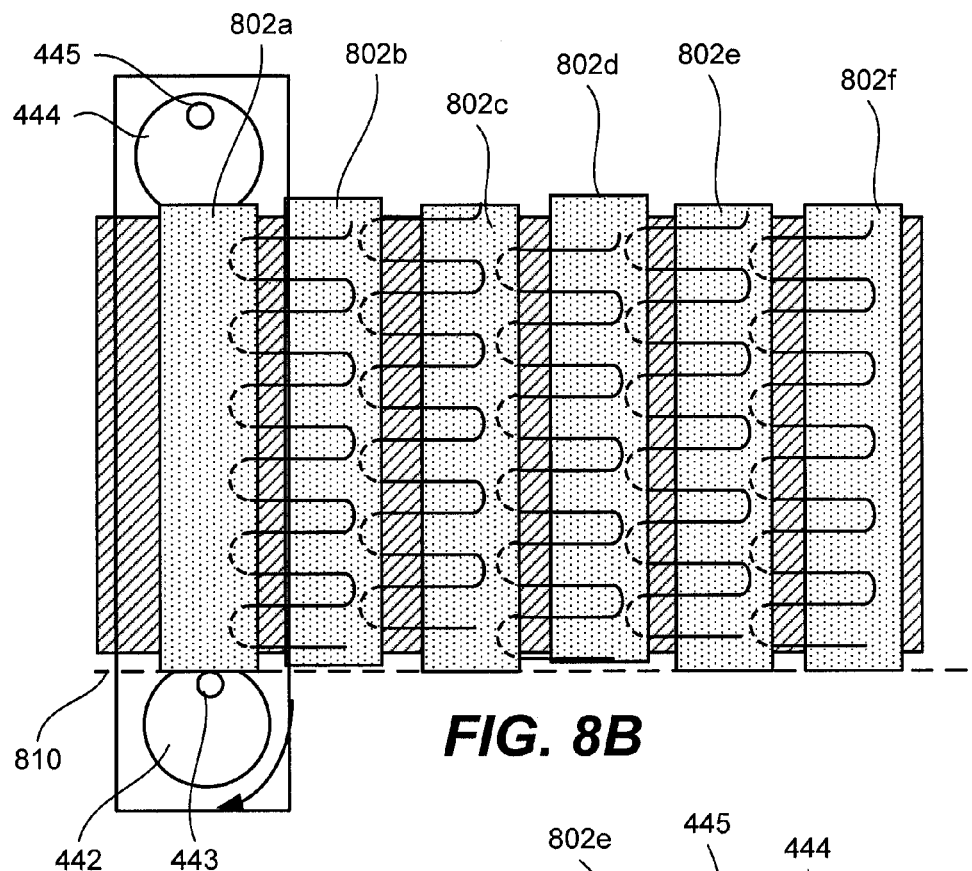
Figure 8C:
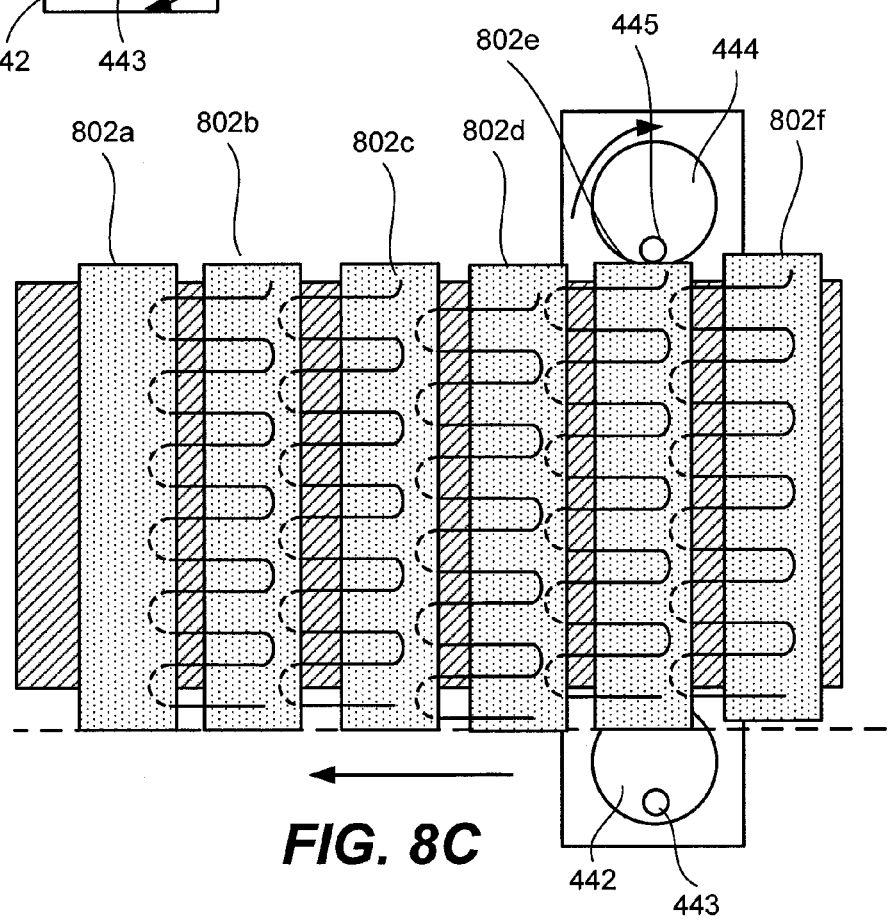

In other embodiments, shown in FIGS. 8A, 813, and 8C, two rotary disks are used to align cells. Cells 802a-802f are positioned in receiving areas of alignment plate 430. Cells 802b and 802d are shifted upward with respect to alignment line 810, and at least one cell 802c is shifted downward with respect to alignment line 810. It should be noted that FIGS. 8A, 8B, and 8C illustrate the top views of a portion of the alignment apparatus, and, therefore, these "upward" and "downward" misalignments are actually shifts in a horizontal plane.

As alignment plate 430 moves to the right, rotating disk 442 rotates synchronously with this movement such that pin 443 is positioned towards the cell as the cell passes disk 442 (the "upward" position of pin 443 shown in FIG. 8A). If a cell (like cell 802c) extends beyond alignment line 810, then pin 443 will push this extending cell towards alignment line 810. However, some cells, like cells 802b and 802d, may not reach alignment line 810, and pin 443 will not contact these cells. Furthermore, some cells (like cell 802a) may be already substantially aligned with alignment line 810, in which case, pin 443 may contact such cells without pushing in their respective receiving areas.

While alignment plate 430 advances to the right, another rotating disk 444 may be idle and its pin 445 may be positioned away from the cells to prevent accidental contact with the cells. This rotating disk 444 may be used to align some cells extending away from alignment line 810 (like cell 802b) when alignment plate 430 moves to the left as further described below. In other embodiments (not shown), both disks may move at the same time to effectively center a cell between two pins.

FIG. 8B illustrates a set of cells 802a-802f after alignment plate is moved to the right with respect to rotating disk 442 and some of the cells been contacted by rotating disk 442. Some of the cells, such as cells 802b and 802d, may still remain slightly misaligned and away from alignment line 810. At that point, alignment plate 430 may start moving back to the left, as shown in FIG. 8C. Disk 442 may now be stationary during this part of the operation with its pin 443 pointing away from the cells. At the same time, pin 445 of rotational disk 444 may push any cells extending "upward" (i.e., away) from aligning line 810 back to this line, like cells 802b and 802d.

In other embodiments, one disk may be a rotatable biasing disk. The biasing disk may have a biasing pin positioned at a predetermined distance from the center. This biasing disk is configured to push any photovoltaic cells extending beyond a biasing line towards that biasing line. The biasing line is offset with respect to an alignment line. Another rotational disk (i.e., an "alignment disk") then moves all photovoltaic cells on the alignment plate in an opposite direction against the alignment line and away from the biasing line.

In certain embodiments, a photovoltaic cell alignment apparatus for fabricating a photovoltaic module sub-assembly includes a programmable controller. A programmable controller may include a set of program instructions for providing multiple photovoltaic cells, individually removing the cells from a cell storage cassette using a rotary cell feeder, individually positioning the cells into cell receiving areas of an alignment plate, aligning the photovoltaic cells, and simultaneously transferring the photovoltaic cells to a sealing sheet. The system controller may control operation of the alignment apparatus, such as timing of a rotary feeder, alignment plate, alignment mechanism, and other components. The control system may synchronize operations of some or all components of the apparatus. For example, a system controller may control operation of servo motors, actuators, valves, and other components of the apparatus. The system controller may be part of an overall system-wide controller that is responsible for operations of other apparatuses used for fabrication photovoltaic modules, such as the one described in the context of FIG. 3.

The system controller may include one or more memory devices and one or more processors. The processor may include a CPU or computer, analog, and/or digital input/output connections, stepper motor controller boards, etc. Instructions for implementing appropriate control operations are executed on the processor. These instructions may be stored on the memory devices associated with the controller or they may be provided over a network. In certain embodiments, the system controller controls all or most activities of the photovoltaic cell alignment apparatus. The system controller executes system control software including sets of instructions for controlling the timing of various components, pressure inside the lines (e.g., vacuum lines used for suction cups), and other parameters of particular operations further described below. Other computer programs, scripts, or routines stored on memory devices associated with the controller may be employed in some embodiments.

Typically, there is a user interface associated with the system controller. The user interface may include a display screen, graphical software to display process conditions, and user input devices such as pointing devices, keyboards, touch screens, microphones, etc. The computer program code for controlling the above operations can be written in any conventional computer readable programming language: for example, assembly language, C, C++, Pascal, Fortran, or others. Compiled object code or script is executed by the processor to perform the tasks identified in the program. Signals for monitoring the process may be provided by analog and/or digital input connections of the system controller. The signals for controlling the process are output on the analog and digital output connections of the processing system.

Photovoltaic Cell Alignment Process Examples

Also provided are processes for aligning photovoltaic cells during module fabrication. While the photovoltaic cell alignment apparatus examples described above can be used to perform various alignment operations that yield a set of photovoltaic cells positioned and aligned on a sealing sheet or other module components, the processes are not limited to these apparatuses.

Figure 9:
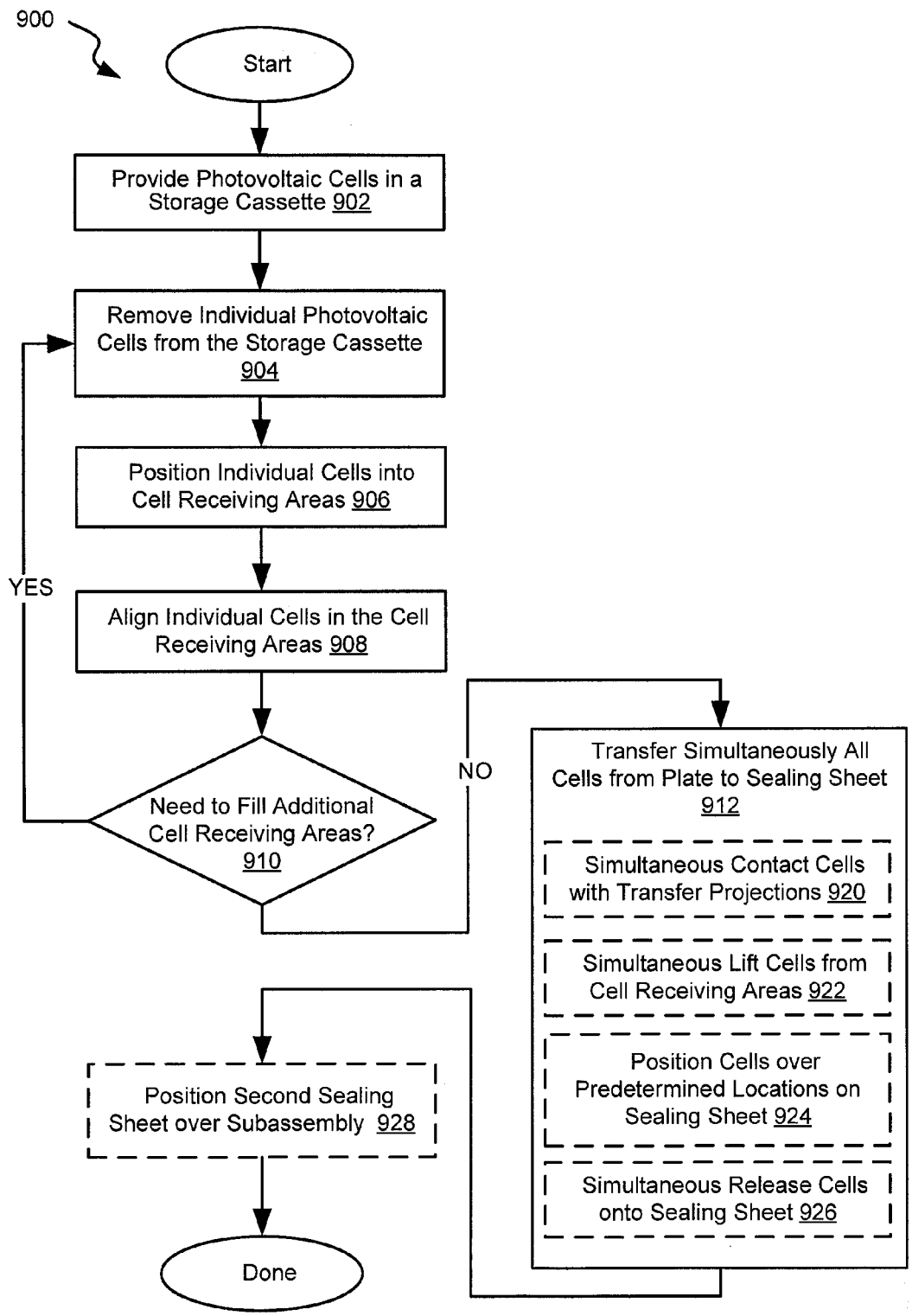
FIG. 9 is a process flowchart of a method for fabricating photovoltaic module sub-assemblies in accordance with certain embodiments.

FIG. 9 is a process flowchart corresponding to a process 900 for fabricating a photovoltaic module sub-assembly in accordance with certain embodiments. Process 900 may start with providing multiple photovoltaic cells in a photovoltaic cell storage cassette in operation 902. Various cell examples are described above in the context of FIG. 1. As it has been previously mentioned, photovoltaic cells typically have unique characteristics that require special handling techniques and mechanisms. For example, sensitive light adsorbing layers and/or contact elements may be easily damaged during improper cell handling. Photovoltaic cells are generally thin and flexible and have a rather substantial surface area. In certain embodiments, photovoltaic cells are between about 50 millimeters and 1000 millimeters in length and/or between about 10 millimeters and 200 millimeters in width. In certain embodiments, the cells include a stainless steel substrate having a thickness of between about 2 mils and 50 mils to support light adsorbing and other layers and conduct an electrical current.

Photovoltaic cells may be added into a storage cassette after certain predetermined intervals, e.g., after completing cell arrangements for one module or after a number of cells in the storage cassette falls below a predetermined threshold. In some embodiments, instead of adding cells into the same cassette, the cassette is replaced with another one. Storage cassettes may be used as temporary photovoltaic cell storages between various operations. For example, cassettes may be installed on a wirer (block 306 in FIG. 3) and used to place photovoltaic cells with attached current collectors fabricated on the wirer.

Process 900 continues with individually removing photovoltaic cells from a storage cassette in operation 904. This operation may involve a rotary cell feeder, an example of which is described above in the context of FIGS. 4A, 5B, and 6 (element 420). A rotary feeder may have one or more sets of cell grabbers (e.g., suction cup or magnet apparatuses) that are rotatable around the feeder's center axis between a first position, at which a set of grabbers is aligned with the storage cassette, and a second position, at which the same set faces an alignment plate. In the first position, a set of cell grabbers establishes contact with the bottom-most cell in the storage cassette. The cell grabbers then force the bottom-most cell through the bottom opening of the storage cassette. In certain embodiments, photovoltaic cells are removed from the storage cassette at an average speed of at least about 4 cells per second or, more particularly, at an average speed of at least about 8 cells per seconds.

Process 900 then continues with individually positioning photovoltaic cells into cell receiving areas of an alignment plate in operation 906. In this operation, a set of cell grabbers carrying a cell move from a first position (facing the storage cassette) to a second position (facing the alignment plate) and release the cell into a corresponding cell receiving area while the grabbers are in the second position. Operations 904 and 906 are repeated for a predetermined number of cells (e.g., until all or a predetermined number of cell receiving areas of the alignment plate are filled). It should be noted that when multiple sets of cell grabbers are used, operations 904 and 906 may be performed in parallel, e.g., one set of cell grabbers removes a cell from a storage cassette, while another set positions another cell (previously removed from the cassette) into a cell receiving area. In a particular embodiment, a rotary feeder includes four sets of cell grabbers that continuously rotate around the rotary feeder's center axis during operations 904 and 906.

In certain embodiments, the alignment plate moves with respect to the rotary cell feeder during or prior to operation 906 to position a new (empty) cell receiving area with respect to a set of cell grabbers carrying a cell. As mentioned above, an alignment plate and/or a combination of the storage cassette and rotary feeder can be movable (with the storage cassette and rotary feeder typically maintaining their relative positions). In certain embodiments, a linear speed of the relative motion between the alignment plate and feeder is synchronized with a rotational speed of the rotary feeder so that the feeder can release a cell into a cell receiving area without slowing down the rotation of the feeder. The cell is released as the set of grabbers that supports it passes through its second position at that predetermined speed.

In certain embodiments, photovoltaic cells are positioned in cell receiving area in operation 906 such that portions of the cells (e.g., the short sides of rectangular cells) extend on one or both sides of the alignment plate. This in turn allows moving the photovoltaic cells in their length-wise directions in subsequent operations (e.g., aligning individual cells in operation 908) by pushing the ends of the cells. In the same or other embodiments, one of the longer sides of each cell extends outside of its cell receiving areas, i.e., extends over an alignment edge of the adjacent cell receiving area.

Process 900 may continue with aligning photovoltaic cells width-wise and/or length-wise in their corresponding cell receiving areas in operation 908. In certain embodiments, width-wise alignment involves forcing photovoltaic cells against respective alignment edges of the cell receiving areas. This may be done using an electromagnetic force, e.g., positioning magnets inside the alignment plate as described above in the context of FIG. 7, gravitational force (e.g., tilting cell supporting surfaces of the cell receiving areas), and/or providing external mechanical forces (e.g., pushing cells with a soft brush). Length-wise alignment may involve pushing photovoltaic cells in their alignment areas along the alignment edges as, e.g., described above in the context of FIGS. 8A-8C. These alignment operations may be performed in parallel with other operations. For example, an alignment plate may advance as the rotary feeder positions cells into receiving areas of the plate. Cells that have been previously positioned in the cell receiving areas may be aligned during this advancement.

In certain embodiments, aligned cells are supported on an alignment plate in their respective aligned position using a combination of gravitational/frictional force and/or an electromagnetic force. Such forces may be needed to prevent misalignment of the cells caused, for example, by motions/accelerations of the alignment plate or establishing initial contacts between the transfer mechanism and cells. For example, an electromagnet may be turned off when cells are positioned into or removed from the receiving areas and turned on during other operations, e.g., when the alignment plate is moved. In specific embodiments, a magnetic force produced by an electromagnet is variable and could be applied at a reduced level during certain operations, e.g., during alignment of the cells in the receiving areas.

Operations 904, 906, and 908 may be repeated for additional photovoltaic cells until a predetermined number of cell receiving areas are filled (decision block 910). Process 900 may then proceed with simultaneously transferring a set of photovoltaic cells from an alignment plate onto a sealing sheet, an encapsulant layer positioned on a sealing sheet, or another module component in operation 912. The cell alignment positions are substantially maintained during the transfer in operation 912. In certain embodiments, photovoltaic cells transferred onto the sealing sheet are positioned within less than about 1 millimeter with respect to length-wise target positions or, more particularly, less than about 0.5 millimeters. In the same or other embodiments, transferred photovoltaic cells are positioned within less than about 0.5 millimeters with respect to width-wise target positions or, more particularly, within less than about 0.25 millimeters.

Sealing sheet examples include glass, polyethylene, polyethylene terephthalate (PET), polypropylene, polybutylene, polybutylene terephthalate (PBT), polyphenylene oxide (PPO), polyphenylene sulfide (PPS) polystyrene, polycarbonates (PC), ethylene-vinyl acetate (EVA), fluoropolymers (e.g., polyvinyl fluoride (PVF), polyvinylidene fluoride (PVDF), ethylene-terafluoethylene (ETFE), fluorinated ethylene-propylene (FEP), perfluoroalkoxy (PFA) and polychlorotrifluoroethane (PCTFE)), acrylics (e.g., poly(methyl methacrylate)), silicones (e.g., silicone polyesters), and/or polyvinyl chloride (PVC), as well as multilayer laminates and co-extrusions of these materials. A typical thickness of a sealing sheet is between about 5 mils and 100 mils or, more specifically, between about 10 mils and 50 mils. A sealing sheet used for transferring the photovoltaic cells in operation 912 may be a front light incident side sheet or a backside sheet. The type of sheet (frontside or backside) may determine how photovoltaic cells are positioned and handled in many operation of process 900. For example, photovoltaic cells may have current collectors attached to the front sides of the cells as, for example, shown in FIG. 1. These current collectors may interfere with suction cups used for handing the cells in a rotary cell feeder and a transfer mechanism. Suction cups generally work better with flat surfaces, while the current collectors create undesirable bumps on the front side of the cells. As such, backsides of the cells may be used for transfer including for transfer from an alignment plate and to a sealing sheet, and, as such, a frontside sealing sheet may be used in this example. In certain embodiments, a module has an encapsulant layer positioned between the sealing sheet and photovoltaic cells. Examples of encapsulant materials include non-olefin thermoplastic polymers or thermal polymer olefin (TPO), such as polyethylene (e.g., a linear low density polyethylene, polypropylene, polybutylene, polyethylene terephthalate (PET), polybutylene terephthalate (PBT), polystyrene, polycarbonates, fluoropolymers, acrylics, ionomers, silicones, and combinations thereof.

Transfer operation 912 may involve multiple cells. In certain embodiments, at least 10 photovoltaic cells are simultaneously transferred from an alignment plate to a sealing sheet or, more particularly, at least 20 cells. Transfer operation 912 may have a series of sub-operations, such as simultaneously contacting multiple cells with transfer projections (block 920), simultaneously lifting all photovoltaic cells (block 922), positioning the cells over a predetermined location on a sealing sheet (block 924), and simultaneously releasing the cells from the transfer cell projections onto the sealing sheet (block 926). These sub-operations may be specifically designed to preserve the respective alignment of the cells established on the alignment plate.

In certain embodiments, transfer operation 912 is repeated at least once for the same sealing sheet. For example, a module may include two or more rows of photovoltaic cells (e.g., two rows of 22 cells in each module). Each row may be fabricated from a separate set of cells aligned on an alignment plate. In the same or other embodiments, one row of cells on the module may be fabricated from multiple sets of aligned cells.

In certain embodiments, process 900 also involves positioning a second sealing sheet over photovoltaic cells positioned on the first sheet while substantially maintaining the relative positions of the cells (block 928). Furthermore, this or other subsequent operations may involve laminating the photovoltaic stack while also substantially maintaining the relative positions of the cells.

CONCLUSION

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

What is claimed is:

1. A photovoltaic cell alignment apparatus for fabricating a photovoltaic module sub-assembly, the photovoltaic cell alignment apparatus comprising:
   a photovoltaic cell storage cassette for storing multiple photovoltaic cells;
   a rotary photovoltaic cell feeder comprising at least one photovoltaic cell grabber arrayed around a first axis of the rotary photovoltaic cell feeder; and
   an alignment plate having a top surface defined by a plurality of angled cell receiving areas having alignment edges, the alignment plate and/or the rotary cell feeder movable along a second axis with respect to each other to position any one of the angled cell receiving areas with respect to the at least one photovoltaic cell grabber of the rotary cell feeder,
   wherein the at least one photovoltaic cell grabber is rotatable about the first axis between a first position at which the at least one photovoltaic cell grabber is aligned with the photovoltaic cell storage cassette and a second position at which the at least one photovoltaic cell grabber faces the alignment plate, and
   wherein, when in the first position, the at least one photovoltaic cell grabber is configured to pull a single photovoltaic cell from the photovoltaic cell storage cassette and to support the single photovoltaic cell in substantially the same position relative to the at least one photovoltaic cell grabber while the at least one photovoltaic cell grabber moves from the first position to the second position, and, when in the second position, the at least one photovoltaic cell grabber is configured to release the single photovoltaic cell into one of the plurality of angled cell receiving areas of the alignment plate.

2. The photovoltaic cell alignment apparatus of claim 1, wherein the alignment plate further comprises one or more magnets configured to force photovoltaic cells positioned in the plurality of angled cell receiving areas in width-wise directions towards the alignment edges.

3. The photovoltaic cell alignment apparatus of claim 1, further comprising a length-wise rotational alignment mechanism comprising a rotatable disk having a center and a pin positioned at a predetermined distance from the center, the length-wise rotational alignment mechanism configured to push photovoltaic cells positioned in the plurality of angled cell receiving areas in length-wise directions while rotating about the center.

4. The photovoltaic cell alignment apparatus of claim 3, wherein the length-wise alignment mechanism further comprises a rotational biasing mechanism comprising a rotatable biasing disk having a biasing center and a biasing pin positioned at a predetermined biasing distance from the biasing center, the rotational biasing mechanism configured to push any photovoltaic cells extending beyond a biasing line towards the biasing line while rotating about the biasing center, and wherein the length-wise rotational alignment mechanism is configured to align all photovoltaic cells on the alignment plate against an alignment line.

5. The photovoltaic cell alignment apparatus of claim 1, wherein the at least one photovoltaic cell grabber comprises a suction cup.

6. The photovoltaic cell alignment apparatus of claim 1, wherein the at least one photovoltaic cell grabber comprises a magnet.

7. The photovoltaic cell alignment apparatus of claim 1, wherein the at least one photovoltaic cell grabber comprises two or more projections, and wherein at least one of the two or more projections is offset with respect to the single photovoltaic cell relative to the other of the two or more projections when at least one photovoltaic cell grabber is in the first position.

8. The photovoltaic cell alignment apparatus of claim 1, wherein the photovoltaic cell storage cassette comprises an opening for individually removing the photovoltaic cells and a magnet for separating the photovoltaic cells during the removal.

9. The photovoltaic cell alignment apparatus of claim 1, further comprising a photovoltaic cell transfer mechanism configured to simultaneously transfer the multiple photovoltaic cells from the alignment plate while substantially maintaining the relative positions of the multiple photovoltaic cells established by aligning the multiple photovoltaic cells on the alignment plate.

10. The photovoltaic cell alignment apparatus of claim 9, wherein the photovoltaic cell transfer mechanism comprises a plurality of transfer projections, and wherein each cell receiving area of the alignment plate has at least two corresponding transfer projections in the plurality of transfer projections.

11. The photovoltaic cell alignment apparatus of claim 10, wherein the plurality of transfer projections comprises transfer suction cups.

12. The photovoltaic cell alignment apparatus of claim 11, wherein each angled cell receiving area comprises a through hole corresponding to the transfer suction cup such that the through hole coincides with the transfer suction cup when the at least one photovoltaic cell grabber is in the second position to determine the presence of photovoltaic cells in each angled cell receiving area.

13. The photovoltaic cell alignment apparatus of claim 12, wherein the photovoltaic cell transfer mechanism is configured to detect the presence of the photovoltaic cells in the cell receiving areas by monitoring a vacuum profile in the transfer suction cups used for transferring the cells.

14. A photovoltaic cell alignment apparatus for fabricating a photovoltaic module sub-assembly, the photovoltaic cell alignment apparatus comprising:

an alignment plate having a top surface defined by a plurality of angled cell receiving areas having alignment edges, the angled cell receiving areas for receiving multiple photovoltaic cells and for aligning the multiple photovoltaic cells against the alignment edges; and a photovoltaic cell transfer mechanism configured to simultaneously transfer the multiple photovoltaic cells from the angled cell receiving areas onto a sealing sheet while substantially maintaining the relative positions of the multiple photovoltaic cells aligned on the alignment plate, the photovoltaic cell transfer mechanism comprising a plurality of transfer arms, each transfer arm comprising a plurality of transfer projections facing the alignment plate and configured to pick the multiple photovoltaic cells from the angled cell receiving areas, to rigidly support the multiple photovoltaic cells during the transfer, and to release the multiple photovoltaic cells onto the sealing sheet, the plurality of transfer arms movable with respect to the alignment plate along a first transfer axis to engage the plurality of transfer projections with the multiple photovoltaic cells, the plurality of transfer arms movable with respect to the alignment plate along a second transfer axis to move the multiple photovoltaic cells between an alignment plate area and a sealing sheet area of the apparatus.

15. The photovoltaic cell alignment apparatus of claim 14, wherein the plurality of transfer arms is movable with respect to the sealing sheet along a third transfer axis to position the multiple photovoltaic cells on the sealing sheet by releasing the multiple photovoltaic cells from the plurality of transfer projections.

16. The photovoltaic cell alignment apparatus of claim 14, wherein each photovoltaic cell is supported by at least two transfer projections of the plurality of transfer projections during the transfer.

17. The photovoltaic cell alignment apparatus of claim 16, wherein the at least two transfer projections supporting each photovoltaic cell are positioned on different transfer arms of the plurality of transfer arms.

18. The photovoltaic cell alignment apparatus of claim 14, wherein the plurality of transfer projections comprises a plurality of suction cups.

19. The photovoltaic cell alignment apparatus of claim 18, wherein the plurality of angled cell receiving areas comprises a plurality of through holes configured to align with the plurality of suction cups, and wherein a pressure level in the plurality of suction cups is measured to determine the presence of multiple cells in the plurality of angled cell receiving areas.

20. A photovoltaic cell alignment apparatus for fabricating a photovoltaic module sub-assembly, the photovoltaic cell alignment apparatus comprising:

a photovoltaic cell storage cassette for storing multiple photovoltaic cells;

a photovoltaic cell feeding device comprising a plurality of suction cups configured to pick-up single photovoltaic cells from the photovoltaic cell storage cassette;

an alignment plate comprising a plurality of alignment slots having alignment edges;

a cell transfer mechanism configured to simultaneously transfer the multiple photovoltaic cells from the alignment plate while substantially maintaining the relative positions of the photovoltaic cells; and a programmable controller.

21. The photovoltaic cell alignment apparatus of claim 20, wherein the programmable controller comprises program instructions for:

providing the multiple photovoltaic cells each having a width and a length in the cell storage cassette;

individually removing the multiple photovoltaic cells from the cell storage cassette using the photovoltaic cell feeding device;

individually positioning the multiple photovoltaic cells into cell receiving areas of the alignment plate while moving the alignment plate with respect to the rotary cell feeder;

aligning the photovoltaic cells width-wise and length-wise in the cell receiving areas to ensure relative positions of the photovoltaic cells as desired in the photovoltaic module; and simultaneously transferring the photovoltaic cells from the alignment plate to a sealing sheet while substantially maintaining the relative positions of the cells during the transfer.

22. A method for fabricating a photovoltaic module subassembly using a photovoltaic cell alignment apparatus, the method comprising:

providing multiple photovoltaic cells each having a width and a length, the multiple photovoltaic cells provided in a photovoltaic cell storage cassette of the photovoltaic cell alignment apparatus;

individually removing the photovoltaic cells from the photovoltaic cell storage cassette using a rotary cell feeder of the photovoltaic cell alignment apparatus;

individually positioning the photovoltaic cells into cell receiving areas of an alignment plate of the photovoltaic cell alignment apparatus while moving the alignment plate with respect to the rotary cell feeder, the cell receiving areas comprising angled bottom surfaces and alignment edges;

aligning the photovoltaic cells width-wise and length-wise in the cell receiving areas to ensure relative positions of the photovoltaic cells as desired in the photovoltaic module; and simultaneously transferring the photovoltaic cells from the alignment plate to a first sealing sheet while substantially maintaining the relative positions of the cells during the transfer.

23. The method of claim 22, wherein the width-wise aligning comprises exerting electromagnetic forces on the photovoltaic cells using one or more magnets installed in the alignment plate to align the photovoltaic cells against the alignment edges of the cell receiving areas.

24. The method of claim 22, wherein the width-wise aligning comprises exerting mechanical forces on the photovoltaic cells by moving the photovoltaic cells with respect to a brush contacting each of the photovoltaic cells to align the photovoltaic cells against the alignment edges of the cell receiving areas.

25. The method of claim 22, wherein the length-wise aligning comprises pushing the photovoltaic cells in an alignment direction along the lengths of the photovoltaic cells using a rotary alignment mechanism such that the photovoltaic cells are aligned along an alignment line.

26. The method of claim 25, wherein the length-wise aligning further comprises, prior to pushing the photovoltaic cells in the alignment direction, pushing at least a subset of the photovoltaic cells in a bias direction opposite of the alignment direction using a rotary bias device such that the photovoltaic cells are offset in the bias direction from the alignment line prior to pushing the photovoltaic cells in the alignment direction.

27. The method of claim 22, wherein the photovoltaic cells transferred onto the first sealing sheet are positioned within less than about 1 millimeter with respect to length-wise target positions.

28. The method of claim 22, wherein the photovoltaic cells transferred onto the sealing sheet are positioned within less than about 0.5 millimeters with respect to width-wise target positions.

29. The method of claim 22, wherein the photovoltaic cells are individually removed from the photovoltaic cell storage cassette and individually positioned into the cell receiving areas on the alignment plate at an average speed of at least about 4 cells per second.

30. The method of claim 22, wherein at least ten photovoltaic cells are simultaneously transferred from the alignment plate to the first sealing sheet while substantially maintaining the relative positions of the multiple photovoltaic cells during the transfer.

31. The method of claim 22, wherein transferring the multiple photovoltaic cells comprises:

simultaneously contacting the multiple photovoltaic cells with plurality of transfer projections, wherein each photovoltaic cell is contacted by at least two transfer projections;

simultaneously lifting all photovoltaic cells positioned on the alignment plate from the cell receiving areas of the alignment plate;

positioning the cells over a predetermined location on the first sealing sheet; and simultaneously releasing the photovoltaic cells from the plurality of transfer projections onto the first sealing sheet.

32. The method of claim 31, further comprising, prior to the transfer, detecting the presence of the photovoltaic cells in the cell receiving areas by monitoring a vacuum profile in suction cups of the plurality of transfer projections.

33. The method of claim 22, wherein the transfer is repeated at least once for the first sealing sheet.

34. The method of claim 22, wherein the photovoltaic cells are between about 50 millimeters and 1000 millimeters in length and between about 10 millimeters and 200 millimeters in width.

35. The method of claim 22, wherein the photovoltaic cells comprise a stainless steel substrate having a thickness of between about 2 mils and 50 mils.

36. The method of claim 22, wherein the photovoltaic cells comprise a ferromagnetic substrate.

37. The method of claim 22, wherein each photovoltaic cell comprises a substrate supporting a photovoltaic stack and an interconnect partially overlapping the stack or the substrate, and wherein individually positioning the photovoltaic cells comprises partially overlapping an interconnect of each cell with a photovoltaic stack or a substrate of an adjacent cell.

38. The method of claim 22, further comprising:
- positioning a second sealing sheet over the multiple photovoltaic cells to form a photovoltaic stack comprising the first sealing sheet, the multiple photovoltaic cells, and the second sealing sheet; and
- laminating the photovoltaic stack while substantially maintaining the relative positions of the multiple photovoltaic cells.

39. The method of claim 22, wherein positioning a first set of the multiple photovoltaic cells into the cell receiving areas on the alignment plate and transferring a second set of the multiple photovoltaic cells from the alignment plate are performed in parallel.

40. The method of claim 39, wherein the alignment plate is a part of an alignment belt continuously moving in the photovoltaic cell alignment apparatus at a predetermined speed.

41. The method of claim 22, wherein individually positioning the photovoltaic cells into the cell receiving areas on the alignment plate comprises positioning the photovoltaic cells such that at least some portions of the lengths of the cells extend on each side of the alignment plate allowing the photovoltaic cells to be moved in a length-wise direction during aligning of the photovoltaic cells.

42. The method of claim 22, further comprising exerting a force onto the photovoltaic cells to prevent misalignment of the photovoltaic cells caused by alignment plate motion or by components of the photovoltaic cell alignment apparatus contacting the photovoltaic cells.

43. The method of claim 22, wherein the first sealing sheet comprises one or more materials selected from the group consisting of a glass sheet, a polyethylene terephthalate sheet, and an encapsulant sheet.

\* \* \* \* \*